(12) United States Patent
Ishikawa et al.

(10) Patent No.: US 11,578,004 B2
(45) Date of Patent: Feb. 14, 2023

(54) METHODS AND APPARATUS FOR DEPOSITING MATERIALS ON A CONTINUOUS SUBSTRATE

(71) Applicant: APPLIED MATERIALS, INC., Santa Clara, CA (US)

(72) Inventors: David Masayuki Ishikawa, Mountain View, CA (US); Brian H. Burrows, San Jose, CA (US)

(73) Assignee: APPLIED MATERIALS, INC., Santa Clara, CA (US)

(*) Notice: Subject to any disclaimer, the term of this patent is extended or adjusted under 35 U.S.C. 154(b) by 955 days.

(21) Appl. No.: 16/306,171

(22) PCT Filed: Jun. 2, 2017

(86) PCT No.: PCT/US2017/035728
§ 371 (c)(1),
(2) Date: Nov. 30, 2018

(87) PCT Pub. No.: WO2017/210583
PCT Pub. Date: Dec. 7, 2017

(65) Prior Publication Data
US 2020/0290932 A1    Sep. 17, 2020

Related U.S. Application Data

(60) Provisional application No. 62/344,962, filed on Jun. 2, 2016.

(51) Int. Cl.
*C23C 16/34* (2006.01)
*C04B 35/628* (2006.01)
(Continued)

(52) U.S. Cl.
CPC ....... *C04B 35/62884* (2013.01); *B65H 51/00* (2013.01); *C04B 35/62868* (2013.01);
(Continued)

(58) Field of Classification Search
CPC ........ C04B 35/62884; C04B 35/62868; C04B 35/80; C04B 2235/5244; C04B 2235/614;
(Continued)

(56) References Cited

U.S. PATENT DOCUMENTS 4,343,836 A    8/1982   Hewkirk et al.
4,601,260 A    7/1986   Ovshinsky et al.
(Continued)

FOREIGN PATENT DOCUMENTS

CN    201634580 U    11/2010
CN    202164233 U     3/2012
(Continued)

OTHER PUBLICATIONS

"Ceramic composition and properties", https://www.britannica.com/print/article/103137 (Year: 2011).*
(Continued)

*Primary Examiner* — Joseph A Miller, Jr.
(74) *Attorney, Agent, or Firm* — Moser Taboada

(57) ABSTRACT

Methods and apparatus for depositing material on a continuous substrate are provided herein. In some embodiments, an apparatus for processing a continuous substrate includes: a first chamber having a first volume; a second chamber having a second volume fluidly coupled to the first volume; and a plurality of process chambers, each having a process volume defining a processing path between the first chamber and the second chamber, wherein the process volume of each process chamber is fluidly coupled to each other, to the first volume, and to the second volume, and wherein the first chamber, the second chamber, and the plurality of process chambers are configured to process a continuous substrate that extends from the first chamber, through the plurality of process chambers, and to the second chamber.

15 Claims, 4 Drawing Sheets

(51) Int. Cl.
*C04B 35/80* (2006.01)
*C23C 16/04* (2006.01)
*C23C 16/54* (2006.01)
*B65H 51/00* (2006.01)

(52) U.S. Cl.
CPC ........ *C04B 35/62871* (2013.01); *C04B 35/80* (2013.01); *C23C 16/045* (2013.01); *C23C 16/342* (2013.01); *C23C 16/345* (2013.01); *C23C 16/545* (2013.01); *C04B 2235/386* (2013.01); *C04B 2235/3873* (2013.01); *C04B 2235/5244* (2013.01); *C04B 2235/614* (2013.01)

(58) Field of Classification Search
CPC ........ C04B 35/62871; C04B 2235/386; C04B 2235/3873; C04B 35/565; C04B 35/62894; C04B 2235/524; C04B 2235/5236; C04B 2235/5224; C04B 35/62844; C23C 16/045; C23C 16/342; C23C 16/345; C23C 16/545; C23C 16/54
See application file for complete search history.

(56) References Cited

U.S. PATENT DOCUMENTS

| | | |
|---|---|---|
| 4,968,918 A | 11/1990 | Kondo et al. |
| 6,811,900 B2 | 11/2004 | Inokuti |
| 2002/0170496 A1 | 11/2002 | Ha et al. |
| 2005/0005846 A1* | 1/2005 | Selvamanickam ..... C23C 14/28 118/718 |
| 2007/0099527 A1 | 5/2007 | Brun et al. |
| 2007/0111367 A1* | 5/2007 | Basol .................. H01L 31/0322 257/E31.027 |
| 2007/0148346 A1 | 6/2007 | Kim et al. |
| 2007/0224348 A1 | 9/2007 | Dickey et al. |
| 2010/0310766 A1 | 12/2010 | Armour et al. |
| 2011/0070375 A1 | 3/2011 | Herzog et al. |
| 2011/0143019 A1* | 6/2011 | Mosso .................... C23C 16/26 427/209 |
| 2012/0017973 A1* | 1/2012 | Beck .................. H01L 31/0322 118/712 |
| 2015/0218692 A1 | 8/2015 | Nakada et al. |

FOREIGN PATENT DOCUMENTS

| | | |
|---|---|---|
| CN | 104164661 A | 11/2014 |
| EP | 0226651 B1 | 4/1991 |
| EP | 0518318 B1 | 11/1996 |
| JP | S 52-85549 A | 7/1977 |
| JP | H01283362 A | 11/1989 |
| JP | 2010-174370 A | 8/2010 |

OTHER PUBLICATIONS

European Search Report for EP 17807587, dated Jan. 13, 2020.
International Search Report dated Aug. 29, 2017 for PCT Application No. PCT/US2017/035728.

* cited by examiner

METHODS AND APPARATUS FOR DEPOSITING MATERIALS ON A CONTINUOUS SUBSTRATE

FIELD

Embodiments of the present disclosure generally relate to continuous tow processing systems and in particular to continuous tow processing systems for depositing coatings on a tow material, such as fiber, using for example directed vapor deposition or chemical vapor infiltration.

BACKGROUND

Ceramic matrix composites (CMCs) are comprised of ceramic fibers embedded in a ceramic matrix. CMCs were developed to address limitations with conventional technical ceramics that prohibit use at high-temperatures and in oxidizing environments. Conventional unreinforced technical ceramics, including alumina, silicon carbide, aluminum nitride, silicon nitride, and zirconia, have low crack resistance and therefore fracture easily under mechanical and thermo-mechanical loading. These material limitations can be addressed by integrating multi-strand long ceramic fibers to enable greater elongation to rupture, fracture toughness, thermal shock resistance, and dynamic fatigue resistance.

Non-oxide polycrystalline ceramic fiber, typically silicon carbide (SiC) fiber, is used as continuous-length structural reinforcement in ceramic matrix composites (CMC). SiC-based ceramic fiber for CMC manufacture has small diameter, high thermal conductivity, low surface roughness, and a carbon-free surface. Furthermore, SiC-based ceramic fiber has high tensile strength as-produced, at high temperature, under high mechanical stress, as well as in oxidizing environments.

Chemical vapor infiltration (CVI) is used to produce an environmental barrier in the form of a thin conformal encapsulation layers on ceramic fibers. In general, the coated fiber has mechanical, thermal, and chemical advantages to un-coated fiber. Boron nitride (BN) and carbon-containing crack-deflecting interfacial coatings on SiC-based fiber surfaces improve SiC-based fiber oxidation resistance at high temperatures. Typically, barrier material such as boron nitride (BN) and carbon-containing crack-deflecting interfacial coatings are deposited on ceramic fibers in multiple sequential coating processes (i.e., one coating process for each layer) using individual deposition systems, separated by vacuum breaks for transfer of the ceramic fibers to each deposition system. However, depositing the coating in multiple sequential steps using individual deposition systems is time-consuming, costly, and inefficient.

Accordingly, the inventors have provided improved processing systems for depositing coatings on a continuous substrate, such as a tow material.

SUMMARY

Methods and apparatus for depositing material on a continuous substrate are provided herein. In some embodiments, an apparatus for processing a continuous substrate includes: a first chamber having a first volume; a second chamber having a second volume fluidly coupled to the first volume; and a plurality of process chambers, each having a process volume defining a processing path between the first chamber and the second chamber, wherein the process volume of each process chamber is fluidly coupled to each other, to the first volume, and to the second volume, and wherein the first chamber, the second chamber, and the plurality of process chambers are configured to process a continuous substrate that extends from the first chamber, through the plurality of process chambers, and to the second chamber.

In some embodiments, an apparatus for processing a substrate includes: a first chamber having a first volume; a second chamber having a second volume fluidly coupled to the first volume; and a plurality of process chambers, each having a process volume defining a processing path between the first chamber and the second chamber, wherein the process volume of each process chamber is fluidly coupled to each other, to the first volume, and to the second volume, and wherein the first chamber, the second chamber, and the plurality of process chambers are configured to process a continuous substrate that extends from the first chamber, through the plurality of process chambers, and to the second chamber; a moveable first carriage configured to rotatably support a spool within the first volume of the first chamber; a first robot assembly movably disposed within the first volume; a transfer assembly movably disposed through the plurality of process chambers; an second robot assembly movably disposed within the second volume; and a moveable second carriage configured to rotatably support a spool within the second volume of the second chamber, wherein the first robot assembly, the transfer assembly, and the second robot assembly operate to transfer an initial portion of a continuous substrate on a first spool rotatably disposed on the first carriage through the plurality of process chambers and to a rotatable spool disposed on the second carriage.

In some embodiments, a method of processing a continuous substrate includes: feeding a continuous substrate from a first chamber through a plurality of process chambers to a second chamber, wherein the continuous substrate is unwound from a first spool within the first chamber and wound onto a second spool within the second chamber; and depositing a ceramic or metal material onto the continuous substrate in the plurality of process chambers.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

Figure 1A:
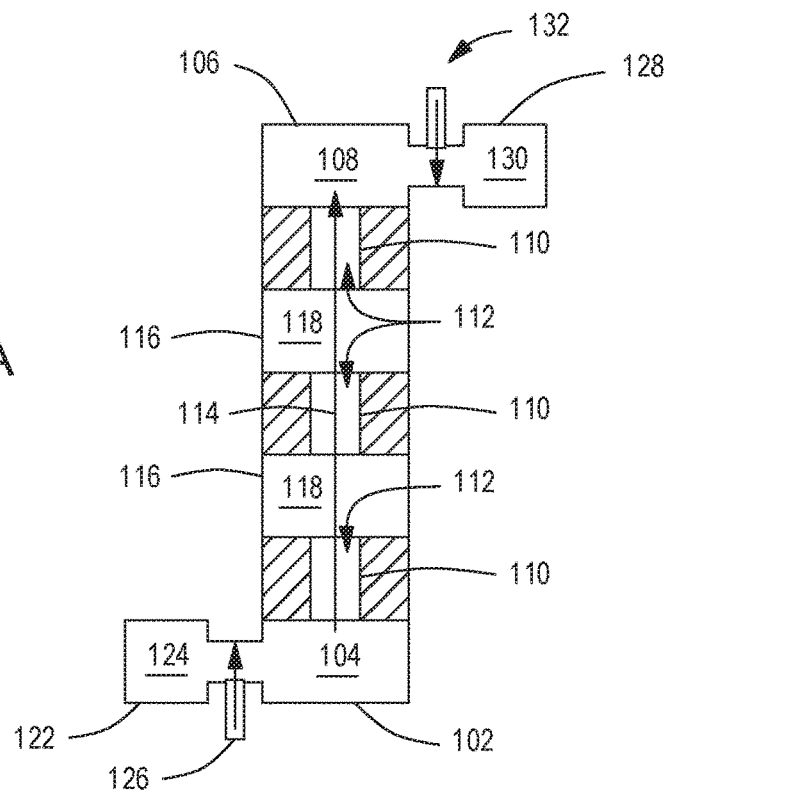
FIGS. 1A-1G depict examples of apparatus for depositing material on a continuous substrate in accordance with some embodiments of the present disclosure.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Embodiments of the present disclosure advantageously provide improved apparatus for depositing material on a continuous substrate. Embodiments of the present disclosure advantageously improve the time, cost, and efficiency of depositing multiple coatings on a continuous substrate. In particular, embodiments of the present disclosure advantageously improve the time, cost, and efficiency of depositing multiple coatings on a continuous substrate comprising a tow, such as tow comprising non-oxide polycrystalline ceramic fibers (for example, silicon carbide (SiC) fibers).

FIGS. 1A-1G depict examples of an apparatus 100 for depositing material on a continuous substrate in accordance with some embodiments of the present disclosure. As used herein, a continuous substrate refers to a substrate that extends beyond the bounds of a process chamber where a deposition process occurs and moves through the process chamber such that the process continues indefinitely until the end of the substrate is reached, rather than in a discrete batch process performed on a substrate completely contained within the process chamber. In some embodiments, the continuous substrate is a bundle of continuous filaments or fibers, for example ceramic fibers (e.g., alumina, silicon carbide, aluminum nitride, silicon nitride, zirconia), commonly referred to as a tow.

As depicted in FIGS. 1A-1G, the apparatus 100 comprises a first chamber 102 having a first volume 104 and a second chamber 106 having a second volume 108 fluidly coupled to the first volume 104. The apparatus 100 comprises a plurality of process chambers 110. Each process chamber 110 has a process volume 112 defining a processing path 114 between the first chamber 102 and the second chamber 106. The process volumes 112 of each process chamber 110 are fluidly coupled to each other, to the first volume 104, and to the second volume 108. In other words, there is a continuous, fluidly coupled path from the first volume 104, through each of the process volumes 112, to the second volume 108. In some embodiments, each process chamber 110 is a chemical vapor deposition or chemical vapor infiltration chamber suitable for producing a barrier in the form of a thin conformal encapsulation layers on the ceramic fibers. Each process chamber can be configured to deposit a different material onto the continuous substrate as the continuous substrate passes through the respective process chamber 110. For example, the process chambers 110 can be configured to deposit one or more ceramic or metal layers on the continuous substrate. In one specific example, a first process chamber 110 can be configured to deposit boron nitride (BN) onto the continuous substrate, a subsequent, second process chamber 110 can be configured to deposit silicon boron nitride (SiBN) onto the continuous substrate, and a subsequent, third process chamber 110 can be configured to deposit silicon nitride (SiN) onto the continuous substrate.

While FIGS. 1A-1G depict an apparatus 100 having three process chambers 110, more or less than three process chambers 110 may be utilized dependent upon the number of coatings to be deposited onto the continuous substrate, or tow.

Figure 1B:
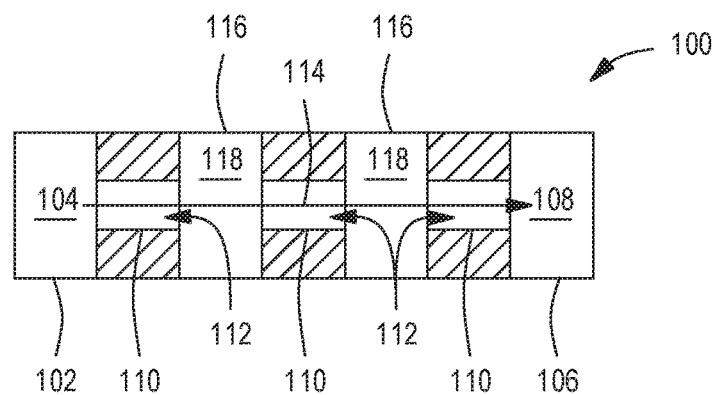
Figure 1C:
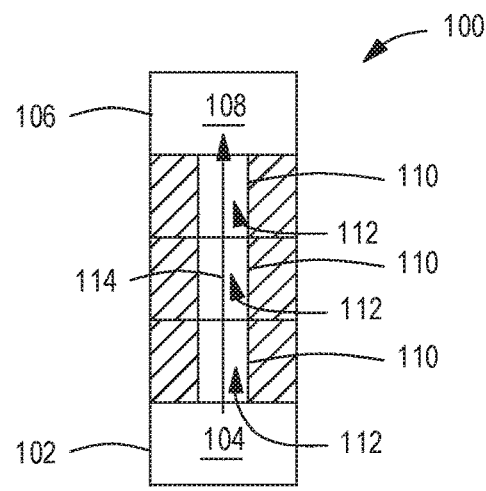

In some embodiments, as depicted in FIGS. 1A, 1B, and 1C each process volume 112 is positioned linearly between the first chamber 102 and the second chamber 106 to provide a linear processing path 114 between the first chamber 102 and the second chamber 106. In some embodiments, as depicted in FIGS. 1A and 1C, the plurality of process chambers 110 are stacked vertically atop the first chamber 102 and the second chamber 106 is stacked atop the plurality of process chambers 110 such that the processing path 114 ascends linearly from the first chamber 102 to the second chamber 106. In some embodiments, as depicted in FIG. 1B, the plurality of process chambers 110 are positioned horizontally, side-by side between the first chamber 102 and the second chamber 106 such that the processing path 114 proceeds horizontally from the first chamber 102 to the second chamber 106. The embodiments, depicted in FIGS. 1A, 1B, and 1C advantageously eliminate a change of direction in the processing path 114 thus reducing risk of damage to the tow and reducing damaged tow material from getting caught in the system machinery. The embodiments, depicted in FIGS. 1A, 1B, and 1C also advantageously improve ease of serviceability of the process chambers 110.

Figure 1D:
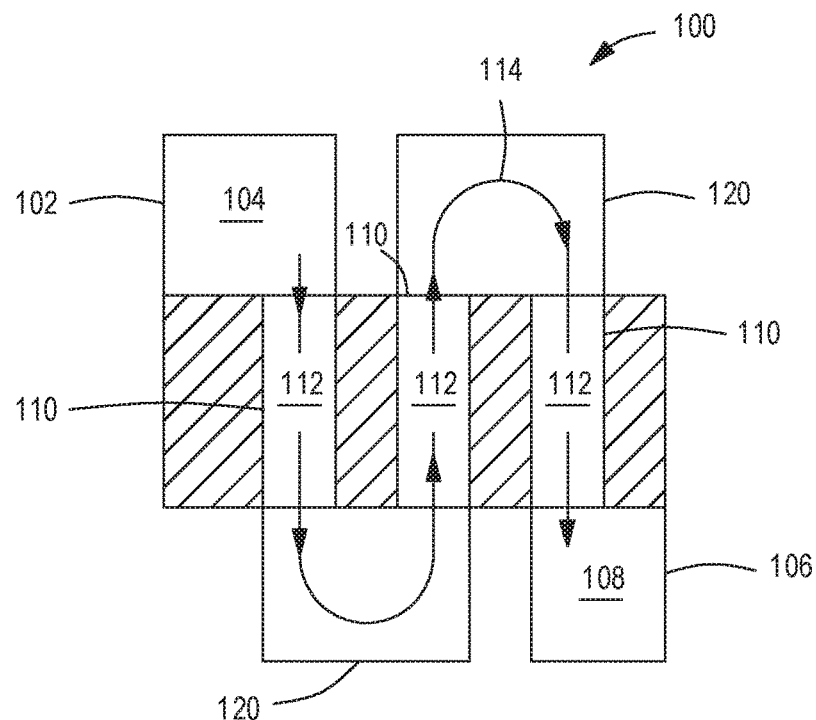
Figure 1E:
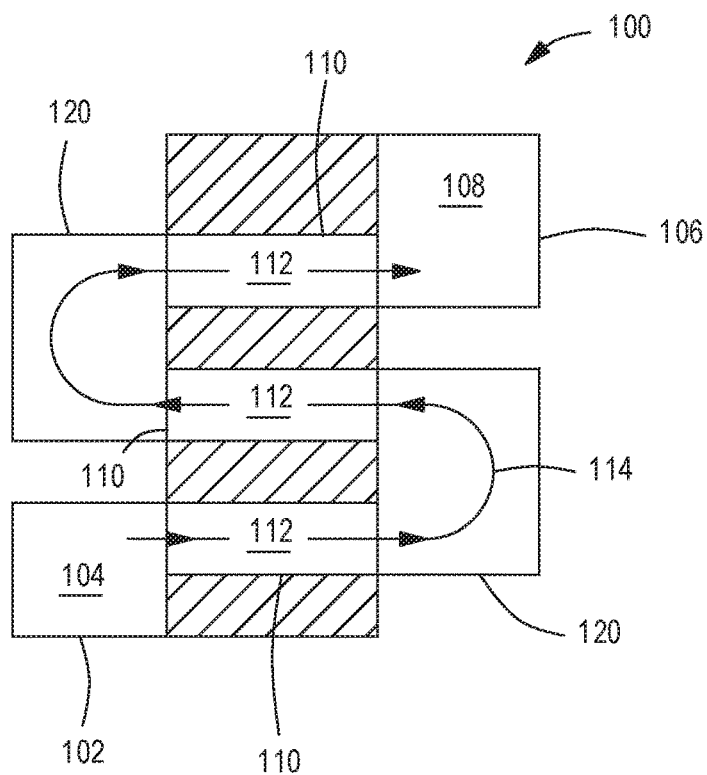

In some embodiments, as depicted in FIGS. 1D and 1E, each process volume 112 is positioned parallel to each other with a reversed course of travel for the continuous substrate. In FIGS. 1D and 1E, the processing path 114 from the first chamber 102 to the second chamber 106 through the plurality of process chambers 110 is serpentine. As used herein, the term serpentine means to move in a winding path, for example in an "s" shape or repeated "s" shapes. As depicted in FIGS. 1D and 1E, the tow travels along the processing path 114 in a first direction from the first chamber 102 through a first process chamber 110. The tow reverses direction within a turn chamber 120 and continues along the processing path 114 in a second direction, opposite the first direction, through a second process chamber 110. The tow reverses direction again within another turn chamber 120 and continues along the processing path 114 in a third direction, opposite the second direction, through a third process chamber 110. While FIGS. 1D and 1E depict a serpentine processing path 114 through three process chambers 110, more or less than three process chambers 110 may be utilized with the processing path 114 winding through the more or less than three process chambers in the manner described above. In addition, each change in direction does not need to be 180 degrees. The embodiments, depicted at FIGS. 1D, and 1E advantageously reduce the footprint of the apparatus 100.

Figure 1F:
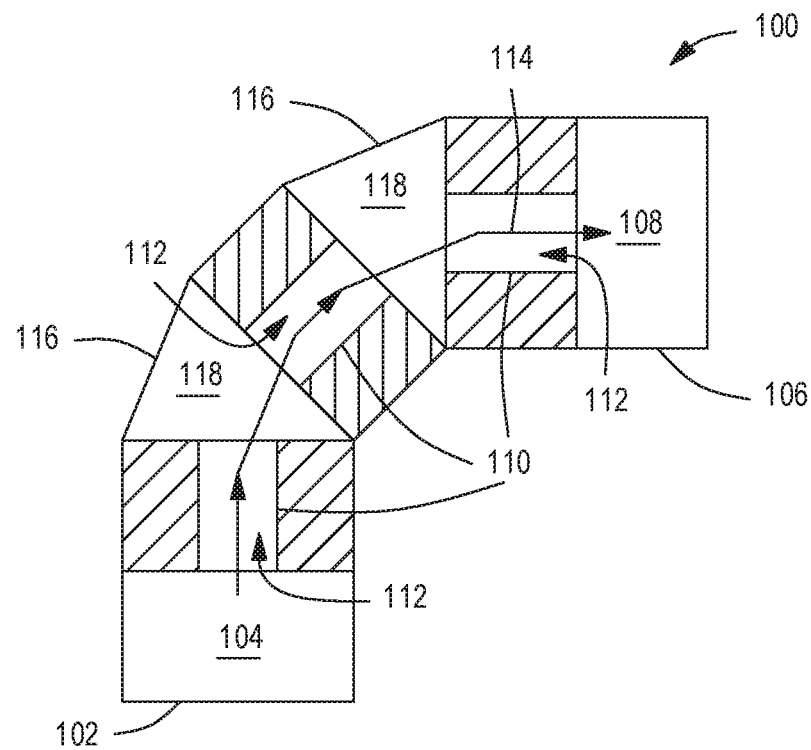
Figure 1G:
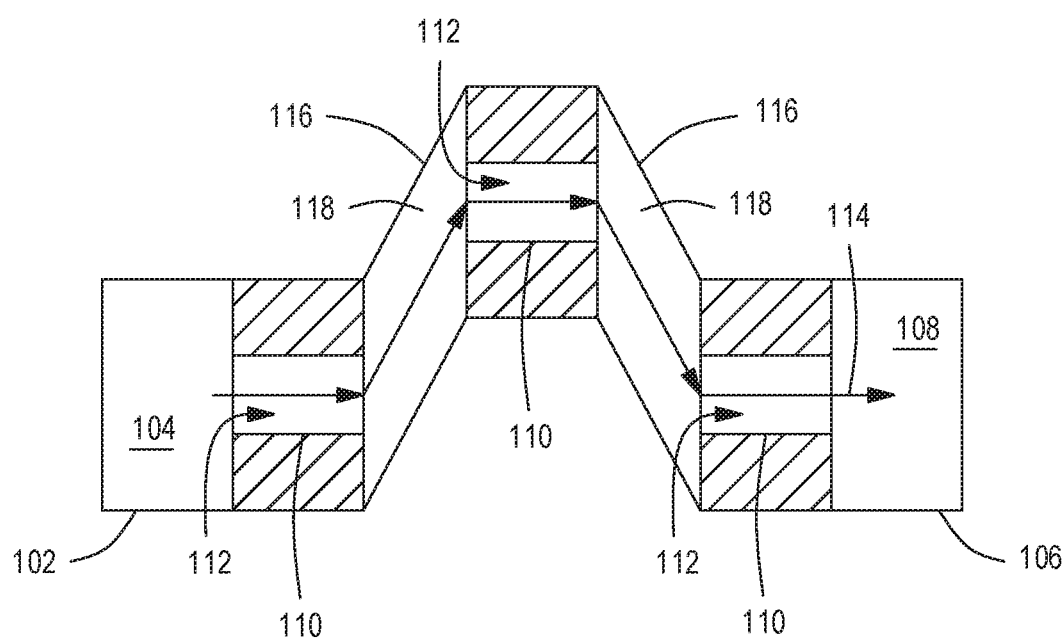
Figure 2:
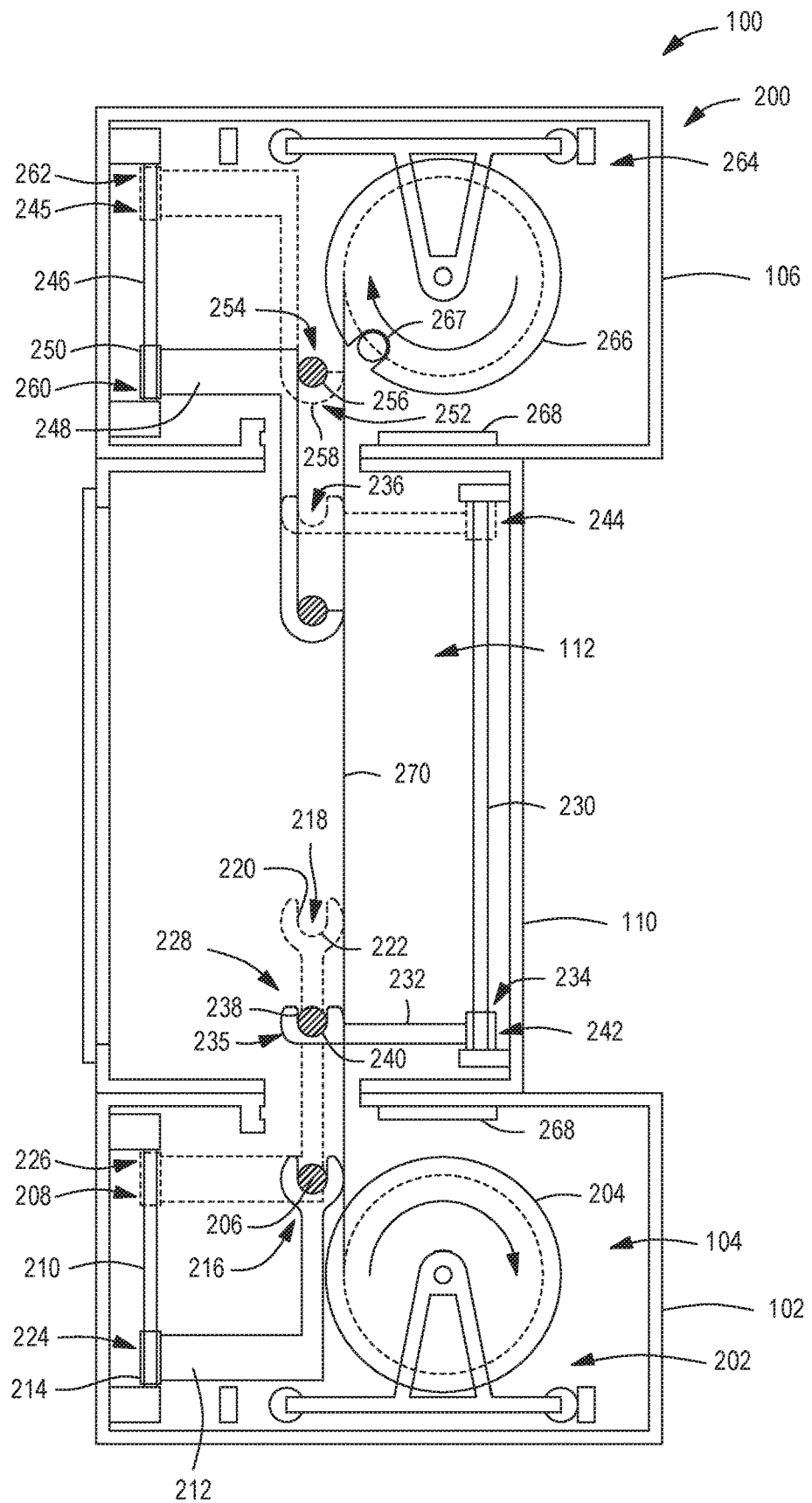
FIG. 2 depicts an automatic feed for apparatus for depositing material on a continuous substrate in accordance with some embodiments of the present disclosure.

In some embodiments, as depicted in FIG. 1F, each process volume 112 is positioned at an angle to each other (e.g., non-linearly). For example, in some embodiments, and as depicted in FIG. 1F, each transition to a new process chamber 110 may incorporate a change in direction of the continuous substrate. In some embodiments, the change in direction can sequentially proceed in the same direction. For example, as shown in FIG. 1F, the change in direction is about 45 degrees between each process chamber 110, such that the initial process direction and the final process direction are perpendicular (i.e., the total change in direction is 90 degrees). The angle between each process chamber, and/or the overall change in process direction can be selected to balance the amount of change in direction as well as the overall footprint of the system. The embodiment of FIG. 1F advantageously reduces the change of direction in the processing path 114 as compared to that shown in FIGS. 1D-1E (i.e., a reversal of direction) and also improves ease of serviceability of the process chambers 110. Similarly, FIG. 1G depicts an embodiment where at least one process chamber 110 is offset from the remaining process chambers 110 to reduce the footprint while minimizing change in direction of the processing path 114.

In some embodiments, for example as depicted in FIGS. 1A, 1B, 1F, and 1G each process chamber 110 is separated from an adjacent process chamber 110 by a fourth chamber 116 having a fourth volume 118 fluidly coupled to the process volume 112 of each adjacent process chamber 110. The fourth chamber 116 contains multiple actuated rollers. The tow passes between the rollers which causes the individual fibers within the tow to move relative to each other, thus improving the efficiency of the chemical vapor infiltration process performed in the process chambers 110

In some embodiments, as depicted in FIG. 1A, a third chamber 122 is coupled to the first chamber 102. The third chamber 122 has a third volume 124 fluidly coupled to the first volume 104. A valve 126 is disposed between the first chamber 102 and the third chamber 122. The valve 126, when closed, seals the first volume 104 from the third volume 124. The valve 126 may be any suitable valve, such as a slit valve or the like.

The third chamber 122 functions as an antechamber to the first chamber. The continuous substrate, such as the tow, is provided on a reel and placed in the first chamber 102 via the third chamber 122. The tow unwinds from the spool and travels through the processing system to the second chamber 106 where the tow winds onto a second spool.

In some embodiments, as depicted in FIG. 1, a fifth chamber 128 is coupled to the second chamber 106. The fifth chamber 128 has a fifth volume 130 fluidly coupled to the second volume 108. A valve 132 is disposed between the second chamber 106 and the fifth chamber 128. The valve 132, when closed, seals the second volume 108 from the fifth volume 130. The valve 132 may be any suitable valve, such as a slit valve or the like. The fifth chamber 128 functions as an antechamber to the second chamber 106.

While not specifically shown, the embodiments of FIGS. 1B-1F may also have antechambers (i.e., a third chamber 122 and fifth chamber 128) and valves 126, 132 in the manner described above to facilitate loading and unloading of the continuous substrate from the processing system.

In some embodiments, the apparatus 100 comprises a system 200 to automatically transfer the continuous substrate, such as the tow, from the first chamber 102 (for example on a first spool having unprocessed tow wound thereon), through the processing chambers 110, to the second chamber 106 (for example to a second spool onto which the processed tow is to be wound). The system 200 comprises a first carriage 202 within the first volume 104 of the first chamber 102. The first carriage 202 can slide between the third chamber 122 (e.g., the ante-chamber, or loading chamber) and the first chamber 102. The first carriage 202 holds a first spool 204 having the continuous substrate, or tow, wound on the spool. The first spool 204 is connected to a motor which rotates the first spool 204 to unwind the tow. Once the first spool 204 is within the first volume 104, the valves 126, 132 to the third chamber 122 and fifth chamber 128 are sealed. Slit valves 268 within the first chamber 102 and the second chamber 106 are opened and the first volume 104 the second volume 108 and any intervening volume (i.e., process volume 112 and fourth volume 118) are pumped to a vacuum.

The continuous substrate, for example, the loose ends of the tow, are attached to a rod 206. The rod 206 may be a quartz rod. A first robot assembly 208 is used to initiate transfer of the rod 206 holding the continuous substrate through the respective processing volumes to the second chamber 106. The first robot assembly comprises a first support beam 210 coupled to an inner sidewall of the first chamber 102, a first actuating arm 212 having a first end 214 movably coupled to the first support beam 210 and a second end 216 having a first groove 218 defined by first sidewalls 220 and a first bottom 222 of the first actuating arm 212. The first actuating arm 212 moves the rod 206 from a first position 224 to second position 226. At the second position 226 the second end 216 of the first actuating arm 212 is within the process volume 112 of the process chamber 110. Any process kits disposed within the process volume(s) 112 of the intervening process chamber(s) 110 may be retracted to provide clearance for the rod 206 during the tow feed operation.

The system 200 further comprises transfer assembly 228 comprising a second support beam 230 coupled to an inner sidewall of the process chamber 110, a second actuating arm 232 having a first end 234 movably coupled to the second support beam 230 and a second end 235 having a second groove 236 defined by second sidewalls 238 and a second bottom 240 of the second actuating arm 232. The first actuating arm 212 transfers the rod 206 to the second actuating arm 232 and returns to the first position 224. In order to open a gap for the rod to travel between the first chamber 102 and the second chamber 106, portions of the process chamber within the process volume 112 (such as process kit components or other internal components, not shown) can retract toward the sidewalls of the process chamber 110. Once the rod 206 is transferred from the first chamber 102 to the second chamber 106, the retracted portions of the process chamber within the process volume 112 return to their original positions. The second actuating arm 232 moves the rod 206 from a first position 242 within the process chamber 110 proximate the first chamber 102 to a second position 244 within the process chamber 110 proximate the second chamber 106. In some embodiments, the second actuating arm 232 moves the rod 206 from a first position 242 within a first process chamber 110 proximate the first chamber 102 to a second position 244 within a subsequent process chamber 110 (such as a second or third process chamber 110, or the like) proximate the second chamber 106. In some embodiments, when the process chambers 110 are vertically stacked, the second actuating arm 232 lifts the rod 206 from the first position 242 to the second position 244.

The system 200 further comprises an second robot assembly 245 to continue moving the rod 206 (and the continuous substrate attached thereto) from the process chamber(s) 110 to the second chamber 106. In some embodiments, the second robot assembly comprises a third support beam 246 coupled to an inner sidewall of the second chamber 106, a third actuating arm 248 having a first end 250 movably coupled to the third support beam 246 and a second end 252 having a third groove 254 defined by third sidewalls 256 and a third bottom 258 of the third actuating arm 248. At a first position 260 within the second chamber 106, the second end 252 of the third actuating arm 248 is within the process volume 112 of a process chamber 110. The second actuating arm 232 transfers the rod 206 to the third actuating arm 248 and returns to the first position 242. The third actuating arm 248 moves from the first position 260 to a second position 262 within the second volume 108.

The system 200 further comprises a second carriage 264 within the second volume 108 of the second chamber 106. The second carriage 264 can slide between the fifth chamber 128 (e.g., an antechamber or unloading chamber) and the second chamber 106. The second carriage 264 holds a second spool 266. The second spool 266 is coupled to a motor and rotates to engage with and remove the rod 206 from the third actuating arm 248. For example, the second spool 266 may include a recess 267 sized to receive and capture the rod 206 as the second spool 266 rotates. The second spool 266 rotates to wind the continuous substrate (e.g., the tow) onto the second spool 266. Prior to winding onto the second spool 266, the first carriage 202 and the second carriage 264 center the continuous substrate 270 (such as a tow) within the process volume(s) 112 of the process chamber(s) 110. The first spool 204 and the second spool 266 rotate simultaneously and deposition proceeds within the process volume(s) 112 until the loose trailed end of the tow is released from the first spool 204 and wound on the second spool 266. Subsequently, the process gases are turned off, the slit valves 268 within the first chamber 102 and second chamber 106 are closed, the third chamber 122 and fifth chamber 128 are vented and the second spool 266 with the coated tow is removed from the system 200.

While the foregoing is directed to embodiments of the present disclosure, other and further embodiments of the disclosure may be devised without departing from the basic scope thereof.

The invention claimed is:

1. An apparatus for processing a continuous substrate, comprising:
    a first chamber having a first volume;
    a second chamber having a second volume fluidly coupled to the first volume;
    a plurality of process chambers, each having a process volume defining a processing path between the first chamber and the second chamber, wherein the process volume of each process chamber is fluidly coupled to each other, to the first volume, and to the second volume, and wherein the first chamber, the second chamber, and the plurality of process chambers are configured to process a continuous substrate that extends from the first chamber, through the plurality of process chambers, and to the second chamber;
    a moveable first carriage within the first volume of the first chamber;
    a first robot assembly movably disposed within the first volume;
    a transfer assembly movably disposed through the plurality of process chambers;
    a second robot assembly movably disposed within the second volume; and
    a moveable second carriage within the second volume of the second chamber, wherein the first robot assembly, the transfer assembly, and the second robot assembly operate to transfer an initial portion of a continuous substrate on a first spool rotatably disposed on the first carriage through the plurality of process chambers and to a rotatable spool disposed on the second carriage.

2. The apparatus of claim 1, wherein the continuous substrate is a ceramic fiber tow and wherein at least one of the plurality of process chambers is a chemical vapor deposition or a chemical vapor infiltration chamber.

3. The apparatus of claim 1, further comprising a third chamber, coupled to the first chamber, and having a third volume fluidly coupled to the first chamber, wherein the third chamber is selectively sealable from the first chamber.

4. The apparatus of claim 1, wherein each process volume of the plurality of process chambers is positioned linearly between the first chamber and the second chamber.

5. The apparatus of claim 4, wherein the plurality of process chambers are stacked atop the first chamber and the second chamber is stacked atop the plurality of process chambers.

6. The apparatus of claim 4, wherein each process chamber is separated by a fourth chamber having a fourth volume fluidly coupled to the process volume of each adjacent process chamber.

7. The apparatus of claim 6, wherein the fourth chamber contains multiple actuated rollers.

8. The apparatus of claim 1, wherein each process volume is positioned parallel to each other.

9. The apparatus of claim 8, wherein the processing path from the first chamber to the second chamber through the plurality of process chambers is serpentine, or wherein the processing path from the first chamber to the second chamber through the plurality of process chambers is non-linear.

10. The apparatus of claim 1, wherein each process volume is positioned at an angle to each other.

11. The apparatus of claim 10, wherein the angle and the direction of change of the angle is the same between each successive process volume of the plurality of process chambers.

12. The apparatus of claim 1, wherein the first robot assembly comprises:
    a first support beam coupled to an inner sidewall of the first chamber; and
    a first actuating arm having a first end movably coupled to the first support beam, wherein the first actuating arm is movable between a first position and a second position, wherein at the second position a second end of the first actuating arm having a first groove defined by first sidewalls and a first bottom of the first actuating arm is within the process volume of the process chamber, and wherein the first groove is configured to hold a rod having a first end of the continuous substrate attached to the rod;
    wherein the transfer assembly comprises:
        a second support beam coupled to an inner sidewall of the process chamber; and
        a second actuating arm having a first end movably coupled to the second support beam and a second end having a second groove defined by second sidewalls and a second bottom of the second actuating arm, wherein the second groove is configured to receive the rod from the first actuating arm, and wherein the second actuating arm is moveable from a first position within the process chamber proximate the first chamber to a second position within the process chamber proximate the second chamber;
    and wherein the second robot assembly comprises:
        a third support beam coupled to an inner sidewall of the second chamber; and
        a third actuating arm having a first end movably coupled to the third support beam and a second end having a third groove defined by third sidewalls and a third bottom of the third actuating arm, wherein the third actuating arm is moveable from a first position to a second position within the second volume, and wherein the second end of the third actuating arm is within the process volume at the first position to receive the rod from the second actuating arm.

13. The apparatus of claim 2, further comprising a third chamber, coupled to the first chamber, and having a third volume fluidly coupled to the first chamber, wherein the third chamber is selectively sealable from the first chamber.

14. The apparatus of claim 2, wherein each process volume of the plurality of process chambers is positioned linearly between the first chamber and the second chamber.

15. The apparatus of claim 2, wherein each process volume is positioned at an angle to each other.

* * * * *